(12) United States Patent
Becke et al.

(10) Patent No.: US 7,868,670 B2
(45) Date of Patent: Jan. 11, 2011

(54) PHASE-LOCKED LOOP (PLL) CIRCUIT AND METHOD

(75) Inventors: Georg Becke, Moosburg (DE); Gerd Rombach, Freising (DE)

(73) Assignee: Texas Instruments Deutschland GmbH, Freising (DE)

(*) Notice: Subject to any disclaimer, the term of this patent is extended or adjusted under 35 U.S.C. 154(b) by 109 days.

(21) Appl. No.: 11/842,004

(22) Filed: Aug. 20, 2007

(65) Prior Publication Data

US 2008/0054960 A1 Mar. 6, 2008

(30) Foreign Application Priority Data

Aug. 18, 2006 (DE) .............. 10 2006 038 869

(51) Int. Cl.
*H03L 7/06* (2006.01)

(52) U.S. Cl. .............. 327/156; 327/157; 327/159
(58) Field of Classification Search ............ 327/156, 327/158, 159, 18–21, 147–150; 331/10, 331/14, 17, 177 R, 185; 375/375, 376

See application file for complete search history.

(56) References Cited

U.S. PATENT DOCUMENTS

| 6,304,147 | B1 | 10/2001 | Bonnot |
| 6,414,535 | B1* | 7/2002 | Ooishi ............ 327/538 |
| 6,624,675 | B2 | 9/2003 | Neron |
| 6,661,254 | B1* | 12/2003 | Agrawal et al. ............ 326/41 |
| 6,956,416 | B2* | 10/2005 | Wilson et al. ............ 327/156 |
| 7,323,946 | B2* | 1/2008 | Seefeldt et al. ............ 331/25 |

FOREIGN PATENT DOCUMENTS

| DE | 28 56 211 | 12/1978 |
| JP | 3-240318 | 10/1991 |

* cited by examiner

*Primary Examiner*—Lincoln Donovan
*Assistant Examiner*—Colleen O'Toole
(74) *Attorney, Agent, or Firm*—John J. Patti; Wade J. Brady, III; Frederick J. Telecky, Jr.

(57) ABSTRACT

A phase-locked loop (PLL) circuit includes a reference clock divider with a reference clock input, a phase-frequency detector, a charge pump, a loop filter, a voltage controlled oscillator and a feedback divider. A method of operating the PLL circuit comprises the steps of detecting a failure of a reference clock applied to the reference clock input, disabling the charge pump upon detection of a reference clock failure, monitoring the reference clock to detect restoration of a regular reference clock, upon detection of a regular reference clock, detecting occurrence of the next pulse from the feedback divider, and enabling the charge pump upon detection of the next pulse from the feedback divider.

3 Claims, 2 Drawing Sheets

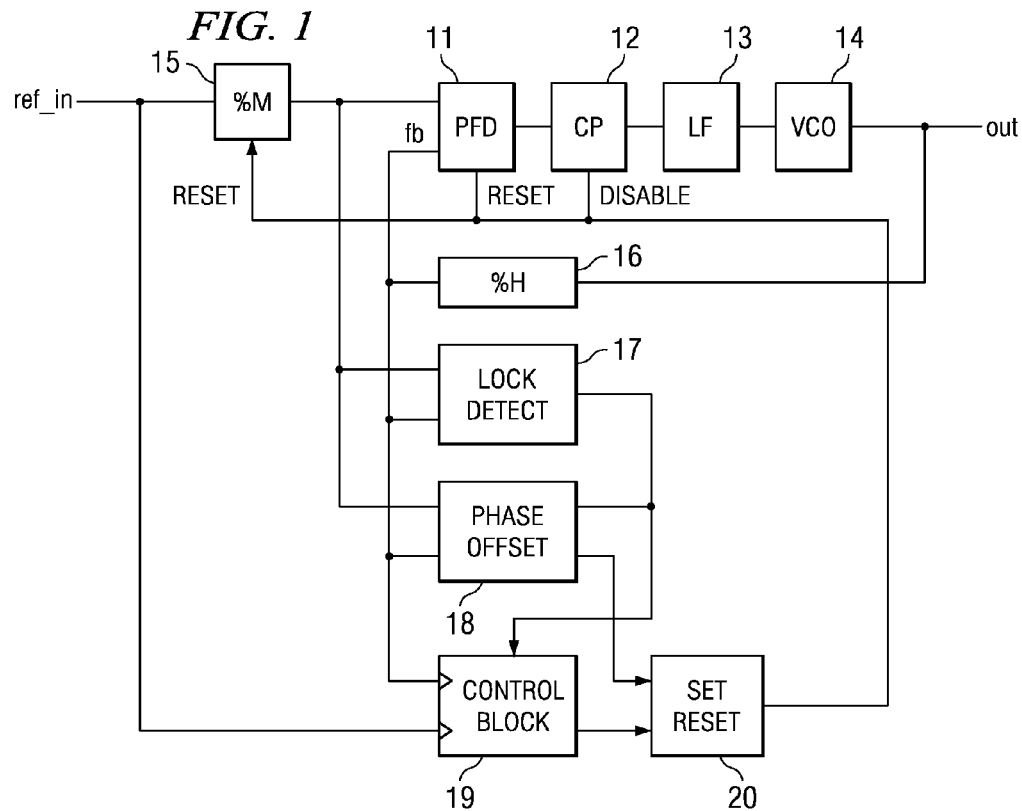
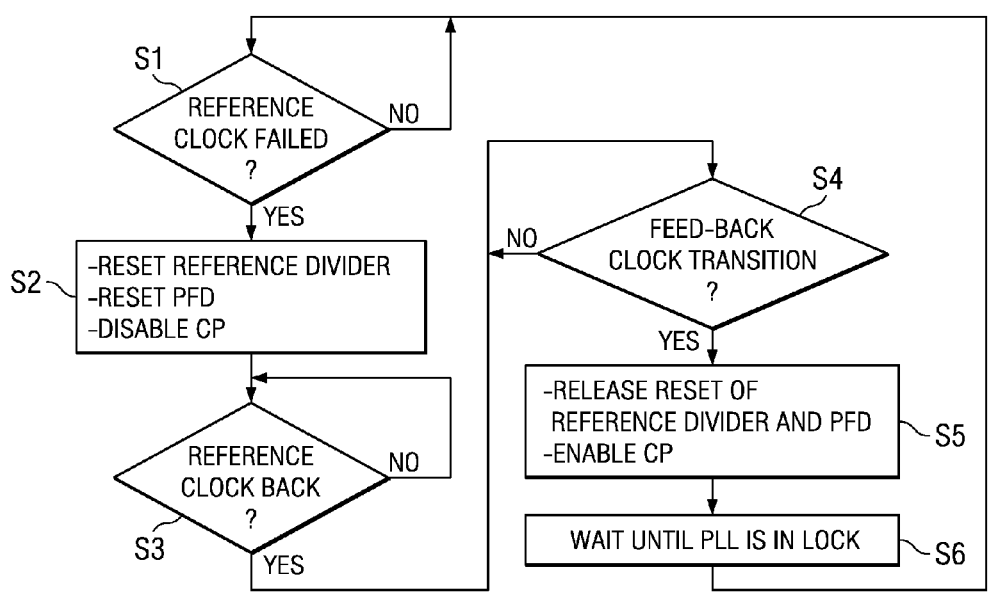

PHASE-LOCKED LOOP (PLL) CIRCUIT AND METHOD

The invention generally relates to a phase-locked loop (PLL) circuit and method of its operation. More particularly, the invention relates to a circuit and method of holding a phase-locked loop as a result of an input reference clock failure.

BACKGROUND

Phase-locked loops are widely used in integrated circuits such as, for example, when it is required to generate an oscillator signal with a voltage controlled oscillator (VCO) under control of a reference input signal from a reference clock. In a phase-locked loop driven system, it is often required to keep the system ongoing for a short time while the reference clock is missing; for example, if the reference clock is faulty or has disappeared. During the time when the reference clock is missing, the system should be able to drive into a safety recover mode. A simple recover mode could be to switch to a redundant reference clock. However, it would be desirable to keep the output of the PLL stable in frequency and phase while the reference clock is missing. The invention has been devised with the foregoing in mind.

SUMMARY

The invention provides a PLL circuit and method of its operation that includes a reference clock divider with a reference clock input, a phase-frequency detector, a charge pump, a loop filter, a voltage controlled oscillator and a feedback divider. The method comprises the steps of detecting a failure of a reference clock applied to the reference clock input, disabling the charge pump upon detection of a reference clock failure, monitoring the reference clock to detect restoration of a regular reference clock, detecting occurrence of the next pulse from the feedback divider, and enabling the charge pump upon detection of the next pulse from the feedback divider.

With the inventive method, when a reference clock failure is detected, the control loop is frozen and the voltage controlled oscillator continues operating at a constant frequency without any disruption. As soon as a regular reference clock is received again, the reference clock divider can be reset upon detection of the next pulse from the feedback divider. The step of detecting a failure of a reference clock can include a step of monitoring the phase-offset between the reference and feedback clock inputs to the phase-frequency detector.

Preferably, the method also comprises the steps of monitoring the phase-offset between the reference and feedback clock inputs to the phase-frequency detector to detect a locked condition of the PLL and, upon detection of a locked condition of the PLL, returning to the step of monitoring the reference clock applied to the reference clock input; i.e., returning to normal operation of the PLL.

The invention also provides a PLL circuit that includes a reference clock divider with a reference clock input, a phase-frequency detector, a charge pump, a loop filter, a voltage controlled oscillator and a feedback divider. The circuit is operable to perform the method provided by the invention. Furthermore, the PLL circuit comprises a reference clock failure detection circuitry with inputs connected to the inputs of the phase-frequency detector and a comparing means adapted to compare the phase offset between clock signals at the inputs to the reference clock failure detection circuitry with a predetermined value. The reference clock failure detection circuitry provides a reference clock failure indication signal when the phase offset exceeds the predetermined value.

Preferably, the PLL circuit further includes locked condition detection circuitry with inputs connected to the inputs of the phase-frequency detector, and comparing means adapted to compare the phase offset between clock signals at the inputs to the locked condition detection circuitry with a predetermined value. The locked condition detection circuitry can provide a locked condition indication signal when the phase offset is below the predetermined value.

BRIEF DESCRIPTION OF THE DRAWINGS

Further advantages and features of the invention will become apparent from the detailed description of an example preferred embodiment given below with reference to the accompanying drawings, wherein:

FIG. 1 is a schematic diagram of a phase-locked loop circuit according to the invention;

FIG. 2 is a flow diagram of the method of hold a phase-locked loop according to the invention.

DETAILED DESCRIPTION

Figure 3:
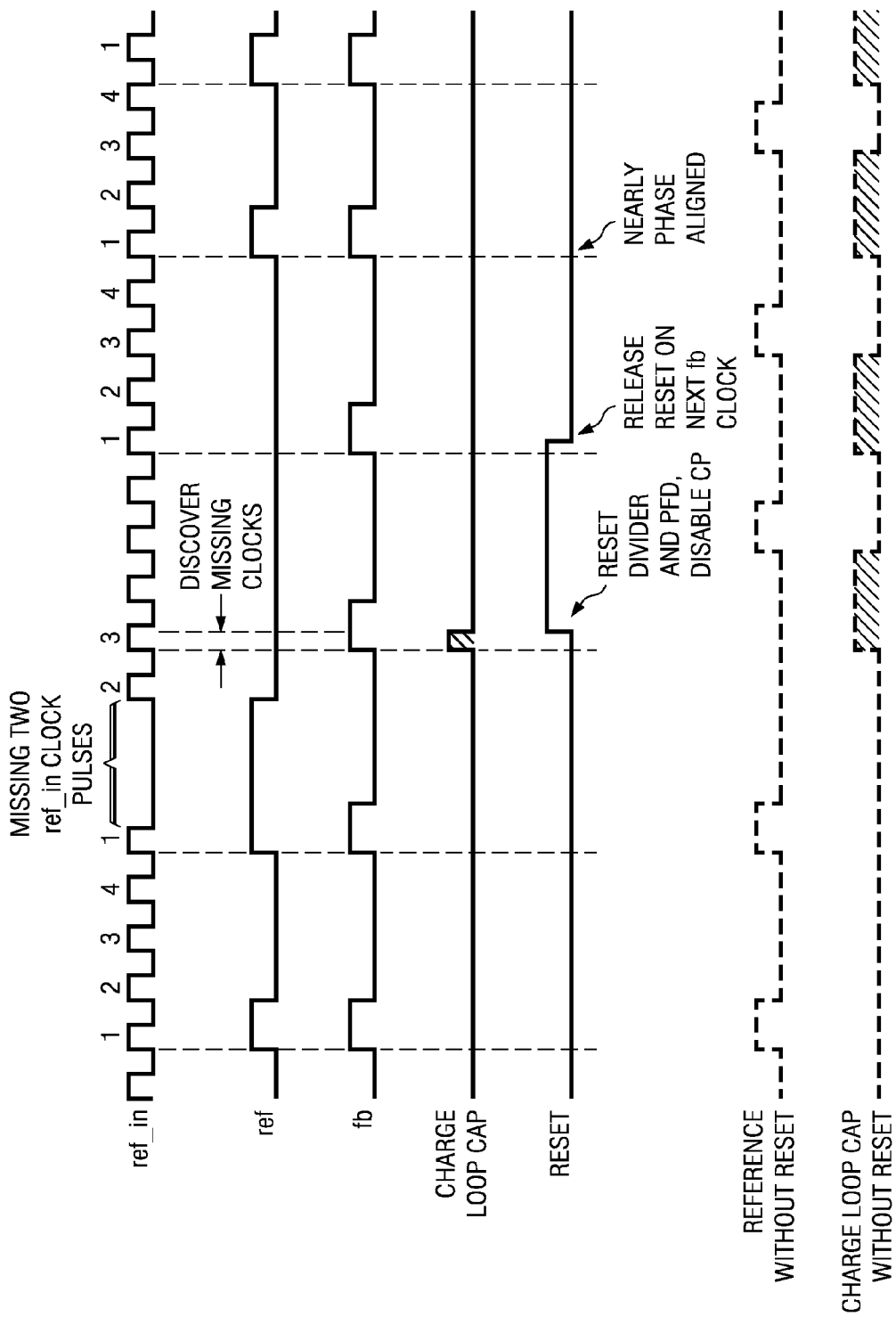
FIG. 3 is a diagram of the pulse hold sequence according to the invention.

An example implementation is described with reference to FIGS. 1-3.

FIG. 1 shows a phase-locked loop circuit having a phase frequency detector 11, a charge pump 12, a loop filter 13 and a voltage controlled oscillator (VCO) 14 connected in series. A reference clock divider 15 has an output connected to a first input of the phase frequency detector 11 and has an input which is operable to receive a reference clock signal ref_in. The output of the VCO 14 is fed to a feedback clock divider 16, the output of which is connected to a second input of the phase frequency detector 11, such that a feedback signal from the VCO 14 can be compared with the reference signal at the phase frequency detector 11. This configuration of phase-locked loop shown in FIG. 1 is well known in the art.

When a signal ref-in is applied to the input of the reference divider 15, the phase difference between the reference signal and the output signal from the VCO 14 detected at the phase frequency detector 11 is converted into a control signal, which drives the charge pump 12 to apply a control signal to the VCO 14 through the loop filter 13.

The PLL circuit also has a lock detector 17, a phase offset detector 18 and a control block 19. The lock detector 17 receives an input from the output of the reference divider 15 and the output of the feedback divider 16 and is operable to detect when the PLL is in lock. The lock detector 17 determines when the PLL is in lock by comparing the output of the reference divider 15 and the output of the feedback divider 16. When the phase difference between the two outputs is less than a predetermined value, the PLL is in lock. The phase offset detector 18 receives inputs from the output of the reference divider 15, the output of the feedback divider 16 and the output of the lock detector 17 and performs the opposite function to the lock detector 17, by detecting when the loop is out of lock. When the phase offset detected by the phase offset detector 18 exceeds the predetermined value, the PLL is out of lock. The outputs of the lock detector 17, the phase offset detector 18 and the reference divider 15 are input to the control block 19, which controls the settings of the components in the PLL circuit based on whether the PLL is in or out of lock. The outputs of the phase offset detector 18 and the control block 19 form the inputs to a latch module 20, which is a simple flip-flop circuit with a set input and a reset input.

Referring now to FIG. 2, in the first step of the method, step S1, the missing or faulty input reference clock is discovered when the phase offset detector 18 detects that the phase offset between the outputs of the reference divider 15 and the feedback divider 16 is greater than a predetermined value. A phase offset between the reference clock and the feedback clock that is greater than a predetermined value will indicate that the reference clock is missing or faulty, thus causing the PLL to be out of lock. The missing clock pulses from the reference clock are illustrated in FIG. 3.

In step S2, the actual state of the phase-locked loop (PLL) at the time of discovery of the missing reference clock is frozen by disabling the charge pump 12 (such that the capacitor in the charge pump 12 cannot charge or discharge) and holding the voltage controlled oscillator (VCO) 14 at a constant frequency.

In step S3, the next valid input reference clock is found and, in step S4, the next PLL feedback clock pulse at the phase frequency detector (PFD) 11 input is detected.

In step S5, upon the transition of the next feedback clock pulse at the PFD 11, the reference clock divider 15 is reset and the charge pump 12 is enabled. By resetting the reference divider 15, the phase displacement at the input of the PFD 11 is minimized and the state of the PLL output frequency remains substantially unchanged. It is important to reset the reference clock divider 15 in synchronization with the detection of the next pulse from the feedback divider 16, otherwise the reference divider 15 resumes at an undefined state and this, in turn, leads to a big phase displacement. In step S6, when it is detected at the lock detector 17 that the PLL is locked again, the sequence is started anew and the reference clock signal is monitored.

In an analog PLL, the loop filter 13 capacitor stores the state of the loop during the time that the reference clock has failed. Charging and discharging of the capacitor in the loop filter 13 must then be disabled during the hold sequence. Thus, the output frequency of the PLL circuit can be kept constant while the reference clock is missing.

An advantage of this method is that it attempts to bring the PLL back in lock in an ad hoc manner, by initializing the reference divider and the PFD and releasing the charge pump afterwards. Thus the PLL does not require a whole lock sequence to recover from a faulty reference clock. This can be seen in FIG. 3, which shows the pulse diagram of the hold sequence with a reference clock divider by 4.

Although the invention has been described with reference to a specific embodiment, it is not limited to this embodiment and no doubt alternatives will occur to the skilled person which lie within the scope of the invention as claimed.

What is claimed is:

1. An apparatus comprising:
  a phase-locked loop circuit that receives a reference clock signal, wherein the phase-locked loop circuit includes:
    a phase-frequency detector;
    a charge pump that is coupled to the phase-frequency detector;
    a voltage controlled oscillator that is coupled to the charge pump, wherein the voltage controlled oscillator operates at a substantially constant frequency when the charge pump is disabled;
  reference clock failure detection circuitry with inputs connected to the inputs of the phase-frequency detector, wherein the reference clock failure detection circuitry compares the phase offset between clock signals at the inputs to the reference clock failure detection circuitry with a predetermined value to provide a reference clock failure indication signal when the phase offset exceeds the predetermined value, and wherein the reference clock failure detecting circuitry includes:
    a lock detector that is coupled to the inputs of the phase-frequency detector, wherein the lock detector is operable to detect when the phase-locked loop is in lock by comparing the phase offset between clock signals at the inputs to the lock detector; and
    a phase offset detector that is coupled to the phase-frequency detector; and
  a controller that is coupled to the reference clock failure detection circuitry and to the charge pump, wherein the controller disables the charge pump when the reference clock failure indicated signal is received by the controller, and wherein the controller includes:
    a control block that is coupled to the reference clock failure detection circuitry; and
    a latch module having a set input and a reset input, wherein one of the set and reset inputs is connected to receive an output of the reference clock failure detection circuitry, and the other of the set and reset inputs is connected to receive an output from the control block.

2. The apparatus of claim 1, wherein the lock detector provides a locked condition indication signal to the controller when the phase offset is below a predetermined value.

3. A phase-locked loop circuit comprising:
  a reference clock divider that receives a reference clock signal;
  a phase-frequency detector that is coupled to the reference clock divider;
  a charge pump that is coupled to the phase-frequency detector;
  a loop filter that is coupled to the charge pump;
  a voltage controlled oscillator that is coupled to the loop filter, wherein the voltage controlled oscillator operates at a substantially constant frequency when the charge pump is disabled;
  a feedback divider having an input connected to receive an output of the voltage controlled oscillator and an output connected to a second input of the phase frequency detector;
  reference clock failure detection circuitry with inputs connected to the inputs of the phase-frequency detector, wherein the reference clock failure detection circuitry compares the phase offset between clock signals at the inputs to the reference clock failure detection circuitry with a predetermined value to provide a reference clock failure indication signal when the phase offset exceeds the predetermined value, and wherein the reference clock failure detection circuitry includes:
    a lock detector that is coupled to the phase-frequency detector, wherein the lock detector is operable to detect when the phase-locked loop is in lock by comparing the output of the reference divider and the output of the feedback divider; and a phase offset detector that is coupled to the phase-frequency detector; and a controller that is coupled to the reference clock failure detection circuitry and to the charge pump, wherein the controller disables the charge pump when the reference clock failure indicated signal is received by the controller, and wherein the controller includes:

a control block that is coupled to the lock detector and the phase offset detector; and a latch module having a set input and a reset input, wherein one of the set and reset inputs is connected to receive an output of the phase offset detector, and the other of the set and reset inputs is connected to receive an output from the control block.

* * * * *